(12) United States Patent
Liu

(10) Patent No.: US 9,590,124 B2
(45) Date of Patent: Mar. 7, 2017

(54) PHOTOELECTRIC CONVERSION DEVICE, DEVICE AND ARRAY DEVICE

(76) Inventor: Hung-Ta Liu, Hsinchu County (TW)

( * ) Notice: Subject to any disclaimer, the term of this patent is extended or adjusted under 35 U.S.C. 154(b) by 0 days.

(21) Appl. No.: 13/537,084

(22) Filed: Jun. 29, 2012

(65) Prior Publication Data

US 2013/0000690 A1    Jan. 3, 2013

(30) Foreign Application Priority Data

Jul. 1, 2011    (TW) .............................. 100123404 A

(51) Int. Cl.
*H01L 31/0468* (2014.01)
*H01L 31/0687* (2012.01)
*H01L 31/056* (2014.01)

(52) U.S. Cl.
CPC ........ *H01L 31/0468* (2014.12); *H01L 31/056* (2014.12); *H01L 31/0687* (2013.01); *Y02E 10/52* (2013.01); *Y02E 10/544* (2013.01)

(58) Field of Classification Search
CPC ........... G02F 2001/13312; G02F 1/135; G02F 1/1354; G02F 1/13318; H01L 31/056; H01L 31/0687; H01L 31/0468; Y02E 10/52; Y02E 10/544
USPC ...................... 136/243–265; 428/426; 349/25
See application file for complete search history.

(56) References Cited

U.S. PATENT DOCUMENTS

| 4,663,495 | A   | * | 5/1987  | Berman et al. ............... 136/248 |
| 6,031,655 | A   | * | 2/2000  | Yagyu ..................... G02B 5/201 |
|           |     |   |         | 359/292 |
| 6,233,027 | B1  | * | 5/2001  | Unno et al. ..................... 349/25 |
| 6,383,898 | B1  | * | 5/2002  | Kishimoto .................... 438/482 |
| 6,452,088 | B1  | * | 9/2002  | Schmidt ........................ 136/244 |
| 7,952,156 | B2  | * | 5/2011  | Mitsui et al. ................. 257/435 |
| 2008/0158138 | A1 | * | 7/2008  | Yamazaki et al. ............ 345/102 |
| 2008/0230123 | A1 | * | 9/2008  | Mitsui ................. C09B 23/0066 |
|           |     |   |         | 136/263 |
| 2008/0271784 | A1 | * | 11/2008 | Duston et al. ................ 136/259 |
| 2011/0308574 | A1 | * | 12/2011 | Vaidyanathan ............... 136/246 |

FOREIGN PATENT DOCUMENTS

| CN | 101046627 A | 10/2007 |
| TW | 201040905   | 11/2010 |

* cited by examiner

*Primary Examiner* — Catherine A Simone
(74) *Attorney, Agent, or Firm* — Winston Hsu; Scott Margo

(57) ABSTRACT

A photoelectric conversion device including a transparent substrate, a first electrode, at least a photoelectric conversion layer and a second electrode is provided. The first electrode is located on the transparent substrate. The transparent substrate means that at least some parts of the substrate area are transparent. At least a photoelectric conversion layer is located on the first electrode, wherein the optical light transmittance of the photoelectric conversion layer in at least a portion of the visible spectrum is higher than 20%. The second electrode is located on the photoelectric conversion layer.

1 Claim, 13 Drawing Sheets

PHOTOELECTRIC CONVERSION DEVICE, DEVICE AND ARRAY DEVICE

BACKGROUND OF THE INVENTION

1. Field of the Invention

The present invention relates generally to a photoelectric conversion device, a device and an array device, and more specifically to a photoelectric conversion device, a device and an array device that enables a portion of the visible spectrum to pass through the device.

2. Description of the Prior Art

In general, conventional photoelectric conversion devices are non-transparent. They are widely used in various constructive materials such as roof structures, wall sticks, power generating boards in car roofs, etc. In some particular applications such as glasses curtains, transparent roofs, etc., transparent photoelectric conversion devices require better aesthetics.

Please refer to FIG. 1 schematically depicts a diagram of a conventional transparent photoelectric conversion device assembly 10. The conventional transparent photoelectric conversion device assembly 10 includes a transparent substrate 12, a transparent conductive layer 14, a photoelectric conversion layer 16 and a non-transparent electrode layer 18. The conventional transparent photoelectric conversion device assembly 10 is made by removing parts of the non-transparent electrode layer 18 and parts of the photoelectric conversion layer 16 so that parts of the transparent substrate 12 and parts of the transparent conductive layer 14 are exposed to obtain the effect of light penetration. Due to the photoelectric conversion layer 16 being non-transparent, parts of the photoelectric conversion layer 16 must be removed to obtain light penetration. However, that would reduce light-absorbing properties and lower the electrical energy generated by the conventional transparent photoelectric conversion device assembly 10, leading to bad photoelectric conversion efficiency of the conventional transparent photoelectric conversion device assembly 10. Besides, due to non-transparent palisade-shaped or comb-shaped shelters resulting in bad perspective performances, the conventional transparent photoelectric conversion device assembly 10 should not be a "real" transparent component.

Therefore, it is significant to develop an exact transparent photoelectric conversion device assembly having better photoelectric conversion efficiency.

SUMMARY OF THE INVENTION

The present invention provides a photoelectric conversion device, a device and an array device applying said photoelectric conversion device to solve aforementioned problems.

The present invention provides a photoelectric conversion device including a transparent substrate, a first electrode, at least a photoelectric conversion layer and a second electrode. At least some areas of the transparent substrate are transparent. The first electrode is located on the transparent substrate. At least a photoelectric conversion layer is located on the first electrode, wherein the optical light transmittance of each photoelectric conversion layer in at least a portion of the visible spectrum is larger than 20%. The second electrode is located on the photoelectric conversion layer. As there are more than one photoelectric conversion layers, each of the photoelectric conversion layers can have its own corresponding electrodes having their own electrical fields, thus there may be more than one first electrode and second electrode.

The present invention provides a device including a base and at least a photoelectric conversion device. The base has at least a transparent base substrate. At least a photoelectric conversion device is located on at least a base transparent substrate, wherein the optical light transmittance of each photoelectric conversion layer of the photoelectric conversion device in at least a portion of the visible spectrum is larger than 20%.

The present invention provides an array device including a base substrate, a plurality of bases and a plurality of photoelectric conversion devices. The plurality of bases is located on the base substrate. The photoelectric conversion devices include at least a photoelectric conversion layer and the optical light transmittance of each photoelectric conversion layer in at least a portion of the visible spectrum is larger than 20%.

According to the above, the present invention provides a photoelectric conversion device, a device and an array device applying said photoelectric conversion device, wherein at least apart of the visible spectrum can be transmitted through the photoelectric conversion device. More precisely, the photoelectric conversion device has at least a photoelectric conversion layer allowing at least a part of the visible spectrum to be transmitted through the photoelectric conversion layer. Specifically, the optical light transmittance of the photoelectric conversion layer in at least a part of the visible spectrum is larger than 20%. Thus, the photoelectric conversion device of the present invention can have a higher optical light transmittance than the prior art and the processing costs of patterning non-transparent photoelectric conversion layers can be eliminated.

As described in the prior art, the conventional transparent photoelectric conversion device is formed by removing parts of non-transparent photoelectric conversion layers, but that would reduce the photoelectric conversion efficiency dramatically and increase the processing costs. Because of non-transparent palisade-shaped or comb-shaped shelters, the transparency performances are bad. In other words, the components of the prior art are not transparent enough. The photoelectric conversion device of the present invention having transparent photoelectric conversion layers is actually transparent, which can solve the problems of the prior art.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
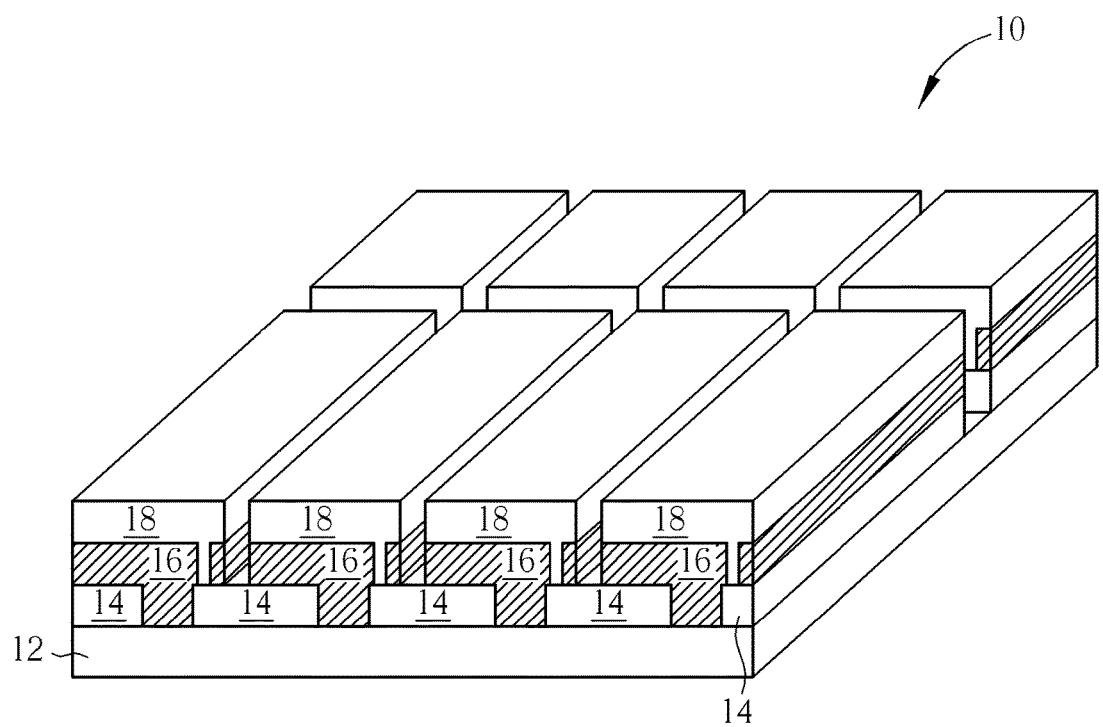
FIG. 1 schematically depicts a diagram of a conventional transparent photoelectric conversion device assembly.
Figure 2:
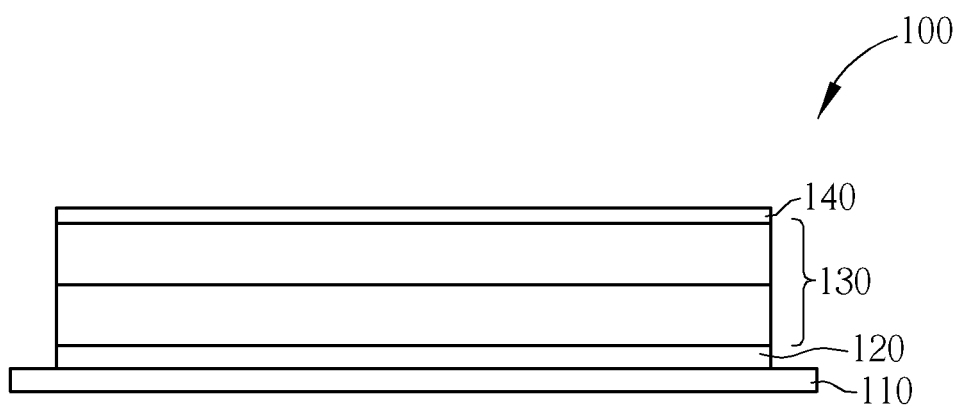
FIG. 2 schematically depicts a cross-sectional view of a photoelectric conversion device according to one embodiment of the present invention.

FIG. 2 schematically depicts a cross-sectional view of a photoelectric conversion device according to one embodiment of the present invention. The photoelectric conversion device 100 includes a transparent substrate 110, a first electrode 120, at least a photoelectric conversion layer 130 and a second electrode 140. The first electrode 120 is located on the transparent substrate 110. At least a photoelectric conversion layer 130 is located on the first electrode 120. The second electrode 140 is located on the photoelectric conversion layer 130. The photoelectric conversion layer 130 is used to transform optical energy into electrical energy. The first electrode 120 and the second electrode 140 are used as a positive electrode and a negative electrode of the photoelectric conversion device 110 respectively, in order to output electrical energy or electrical charge.

The transparent substrate 110 may be a glass substrate or a flexible substrate, but not limited thereto. The transparent substrate 110 may have a planar shape or a curved shape, and the transparent substrate 110 may be made of soda-lime glass, plastic substrate or etc, but it is not limited thereto. The first electrode 120 is a transparent electrode, which may be made of transparent conductive oxide (TCO), such as aluminum zinc oxide (AZO), grapheme or indium tin oxide (ITO). The second electrode 140 may be a transparent electrode as well, which may be made of transparent conductive oxide (TCO) such as aluminum zinc oxide (AZO), grapheme or indium tin oxide (ITO). In another embodiment, the second electrode 140 may be a non-transparent electrode, which may have a rod-shape, a fin-shape or a finger-shape layout to expose a part of the photoelectric conversion layer 130, so that light can pass through. The second electrode 140 may be a metal electrode made of aluminum (AlO), molybdenum (Mo) or etc, but it is not limited thereto. In another way, the photoelectric conversion device 100 may further include a buffer layer (not shown) disposed between the photoelectric conversion layer 130 and the first electrode 120 or the photoelectric conversion layer 130 and the second electrode 140. The buffer layer (not shown) may be made of zinc sulfide, intrinsic zinc oxide (intrinsic ZnO) or etc.

The photoelectric conversion layer 130 may include a P-N junction layer. The P-N junction layer absorbs the sunlight and transforms it to electron-hole pairs; the electron-hole pairs are transferred respectively to the first electrode 120 and the second electrode 140, and from the first electrode 120 to the second electrode 140 through wires. It is worth noting that the photoelectric conversion layer 130 of the present invention enables a part of the visible spectrum to be transmitted through. For example, the optical light transmittance of each photoelectric conversion layer 130 in a portion of the visible spectrum is larger than 20%. The portion of the visible spectrum may be merely red light wave band, blue light wave band, green light wave band, yellow light wave band, purple light wave band, parts of the visible spectrum, or the whole visible spectrum, depending upon the needs. In other words, at least apart of the visible spectrum can penetrate into the photoelectric conversion layer 130, so that the photoelectric conversion layer 130 can absorb at least parts of the wave band of ultraviolet light, infrared light, or visible light such as parts of the wave band of purple light, red light, green light, blue light, purplish red light or etc. Coupled with the first electrode 120 and the second electrode 140, which are made with transparent conductive materials used as transparent electrodes, at least some of the visible light can penetrate the photoelectric conversion device 100 effectively. The first electrode 120 and the second electrode 140 may also be designed to be made of a material that can let the visible light, the ultraviolet and the infrared light pass through.

The photoelectric conversion layer 130 may include photoelectric conversion materials enabling visible light to penetrate, such as silicon layer-multi-compounds layer-nano and organic layer or etc. The silicon layer is the most widely used kind in photoelectric conversion devices. The material of the silicon layer may be crystalline silicon or amorphous silicon, wherein the crystalline silicon may include single crystalline silicon or poly-crystalline silicon, and the electricity generation conversion efficiency of market modules may be over 12%~20% or 10%~18%.

Amorphous silicon may include silicon, silicon carbide, silicon germanium, silane, silicon dioxide, and the electricity generation conversion efficiency of market modules may be more than 6%~9%. The multi-compounds layer is often applied in space or in light-concentrating type photoelectric conversion devices. The material of the multi-compounds layer may include single crystal or polycrystalline, wherein single crystal may include gallium arsenic (GaAs) or indium phosphide (InP), and the electricity generation conversion efficiency of market modules may be more than 18%~30%; and polycrystalline may include cadmium sulfide (CdS), cadmium telluride (CdTe), copper indium selenide (CuInSe2), and the electricity generation conversion efficiency of market modules may be more than 10%~12%. The nano and organic layer is often applied in organic photoelectric conversion devices. The material of the nano and organic layer may be titanium dioxide, and the c electricity generation conversion efficiency of market modules may be lower than 1%.

Figure 3:
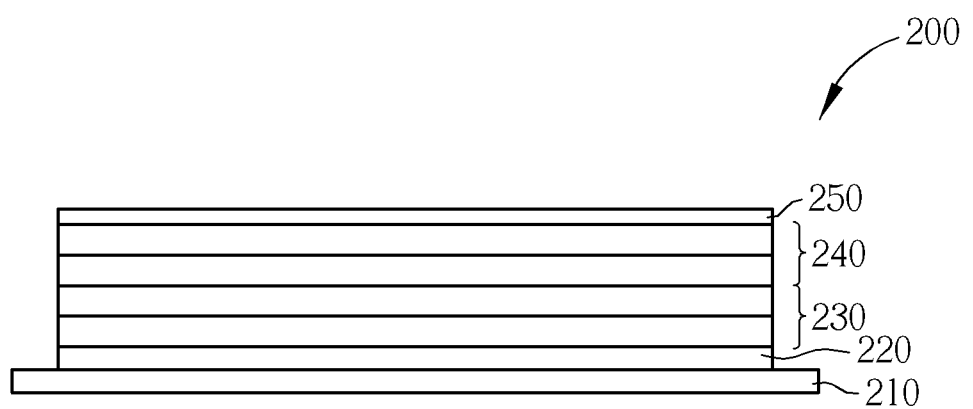
FIG. 3 schematically depicts a cross-sectional view of a photoelectric conversion device according to one embodiment of the present invention.

In this embodiment, the photoelectric conversion layer 130 is a single layer photoelectric conversion material layer. In another embodiment, the photoelectric conversion layer 130 may include a plurality of photoelectric conversion material layers stacked with each other. As shown in FIG. 3, a photoelectric conversion device 200 having a plurality of photoelectric conversion material layers stacked with each other may include a transparent substrate 210, a first electrode 220 located on the transparent substrate 210, a plurality of photoelectric conversion material layers stacked with each other 230, 240 located on the first electrode 220, and a second electrode 250 located on the photoelectric conversion material layer 240, wherein at least some of the visible spectrum can penetrate the photoelectric conversion material layer 230, 240. In a preferred embodiment, some of the visible spectrum can penetrate the photoelectric conversion material layer 230 and the photoelectric conversion material layers 240 are partially overlapping. Thus, the optical light transmittance of the photoelectric conversion device 200 in some wave bands can be improved. There are two layers including the photoelectric conversion material layers 230, 240 in this embodiment. However, there may be multilayers such as three or four layers in another embodiment, but is not limited thereto.

Figure 11:
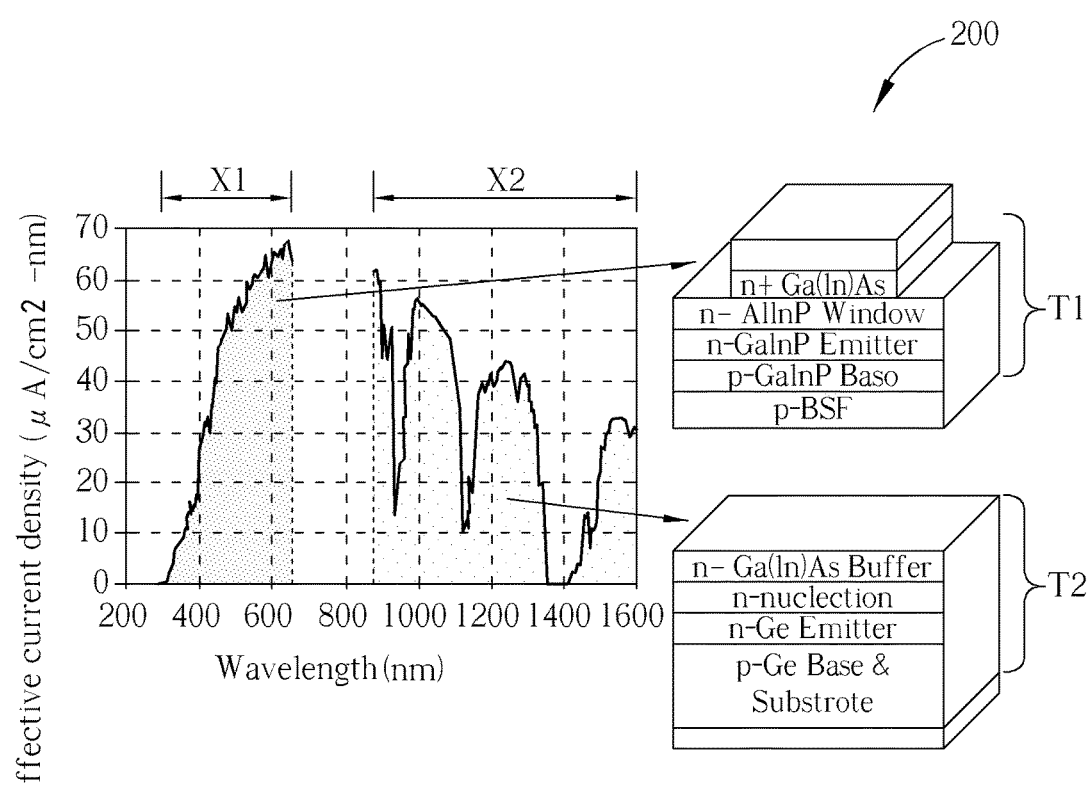
FIG. 11 schematically depicts a combination diagram of the stacked photoelectric conversion device of FIG. 3.

FIG. 11 schematically depicts a combination diagram of the stacked photoelectric conversion device of FIG. 3. The photoelectric conversion device 200 may be composed of a first photoelectric conversion layer assembly T1 or composed of a second photoelectric conversion layer assembly T2, wherein the absorbing coefficient of the first photoelectric conversion layer assembly T1 of ultraviolet light is much larger than in other light wave bands (as wave band X1 shown in the left of FIG. 11), and the absorbing efficiency of the second photoelectric conversion layer assembly T2 of infrared light is much larger than in other light wave bands (as wave band X2 shown in the right of FIG. 11). Thus, at least parts or the whole visible spectrum can penetrate the photoelectric conversion device 200, which is composed by at least one of the first photoelectric conversion layer assembly T1 and the second photoelectric conversion layer assembly T2. That is, the photoelectric conversion device 200 does not absorb or absorbs less the visible light which wave band is between the wave band X1 and wave band X2.

The photoelectric conversion device of the present invention may further include a compensation unit or an auxiliary unit, such as a color filter, an organic light-emitting diode, a backlight, a colored glass, a liquid crystal cell (LC Cell) or a Gamma Curve etc, to correct the chromatic polarization by the chromatic polarization of pixels with different colors. Liquid crystal cell (LC Cell) or liquid crystal gray-scale gamma curve can be corrected by pixels driving voltages of different RGB, CMY, or RGBW colors, or by different color light, thereby correcting color chromatic polarization. This way, the chromatic polarization or the chromatic aberration generated when light passes through photoelectric conversion devices can be corrected.

The photoelectric conversion device of the present invention may be used in various devices. The photoelectric conversion device of the present invention may be applied on a base. The base may be a glass, a protective layer, a touch sensor, a display, a source or etc. A device can be formed by combining the photoelectric conversion device and the base, wherein the device enables at least parts of the visible spectrum to penetrate and converse optical energy into electrical energy. Besides, due to a photoelectric conversion layer transparent to parts of the visible spectrum being used in the present invention, photoelectric conversion layer components of the prior art are not needed in the present invention. Therefore, a transparent photoelectric conversion device having a transparent photoelectric conversion layer can be manufactured in the present invention. More specifically, the device may include a base and at least a photoelectric conversion device, wherein the base has at least a base-transparent substrate used to attach the photoelectric conversion device; and the photoelectric conversion device can therefore be disposed on the base-transparent substrate directly.

Four devices using the photoelectric conversion device of the present invention are presented in the following. However, the photoelectric conversion device of the present invention is not restricted to be used in these four devices.

Figure 4:
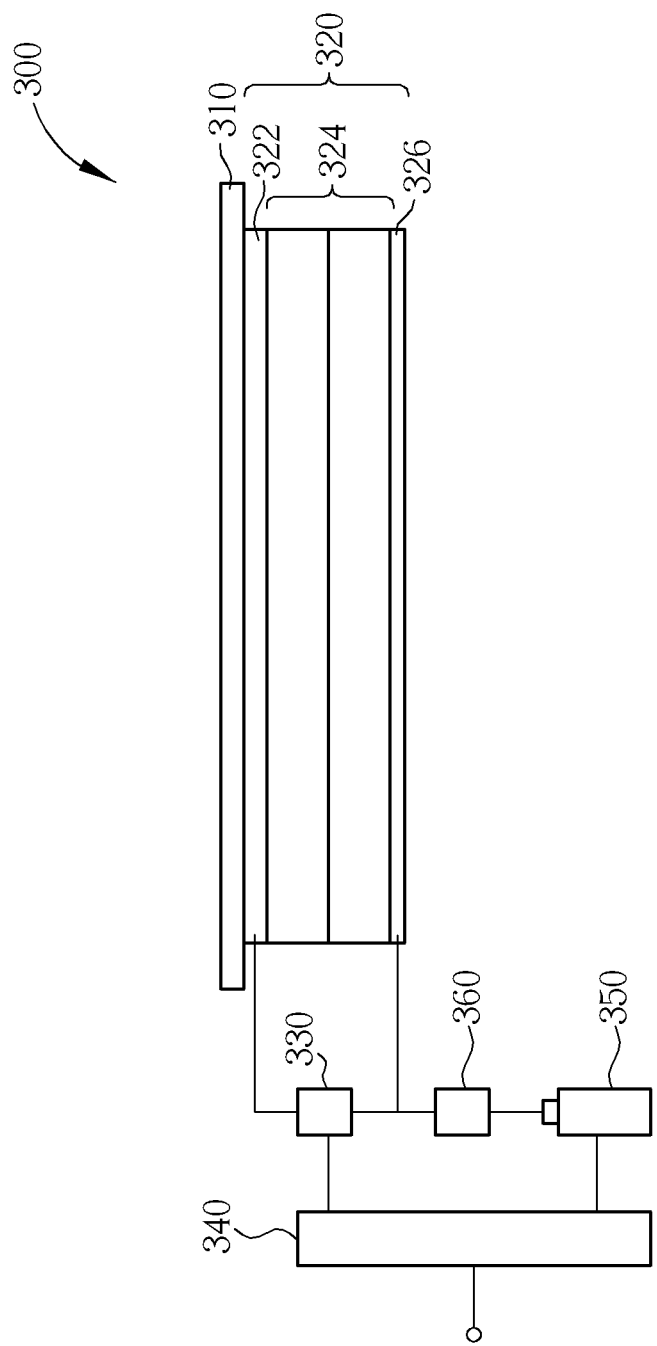
FIG. 4 schematically depicts a cross-sectional view of a device applying a photoelectric conversion device according to one embodiment of the present invention.

FIG. 4 schematically depicts a cross-sectional view of a device utilizing a photoelectric conversion device according to one embodiment of the present invention. A device 300 includes a base 310 and a photoelectric conversion device 320 located thereon. The base 310 may be a glass, a protective layer or a modeling layer etc. For example, the glass may be a transparent window used in a construction, a car windshield, a car window or etc. The protective layer may be a transparent case on a screen of a mobile phone, a display etc, but it is not limited thereto. Thus, the base 310 can be a base-transparent substrate itself used to attach the photoelectric conversion device 320. In other words, the photoelectric conversion device 320 and the base 310 can share one substrate. So, the first electrode 322 is disposed on the base 310 directly, and the photoelectric conversion layer 324 and the second electrode 326 are disposed sequentially on the first electrode 322. The method of forming the photoelectric conversion device 300 may be: a substrate or a wafer (not shown) is provided, and the photoelectric conversion device 320 is formed on the substrate or the wafer. Due to the substrate or the wafer being non-transparent, a stripping process is performed to strip the photoelectric conversion device 320, and then the photoelectric conversion device 320 is fitted on the base 310, which means that the manufacturing of the device 310 is finished. In another embodiment, the photoelectric conversion device 320 may further include a transparent substrate (not shown) having the first electrode 324, the photoelectric conversion layer 324 and the second electrode 326 sequentially formed thereon and the transparent substrate (not shown) directly combining with the base-transparent substrate of the base 310. That is, the base 310 and the photoelectric conversion device 320 do not share one substrate and can also form a structure similar to the device 310.

In one case, the device 300 may include a charge storage device 330 used to store the electrical energy generated by the photoelectric conversion device 320. In another case, the device 300 may include a power switch 340 and a battery 350. As the remaining electrical energy amount of the battery is less than a predetermined value, the electrical energy of the charge storage device is delivered through switching. Furthermore, the device 300 may include a charge control circuit 360. As the remaining electrical energy amount of the battery is less than a predetermined value, it will be charged.

Figure 5:
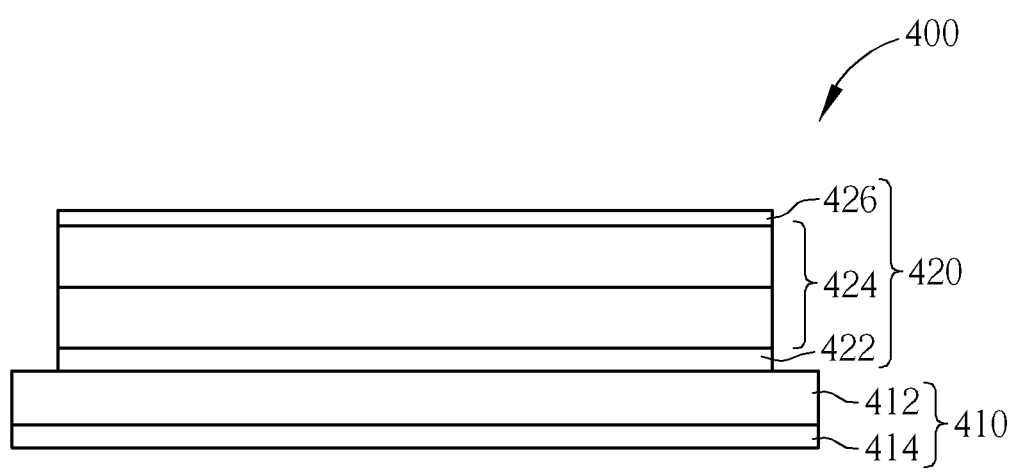
FIG. 5 schematically depicts a cross-sectional view of a device applying a photoelectric conversion device according to one embodiment of the present invention.

FIG. 5 schematically depicts a cross-sectional view of a device utilizing a photoelectric conversion device according to one embodiment of the present invention. As shown in FIG. 5, the photoelectric conversion device 420 of the present invention may be used with a touch sensor 410 to form a device 400. The touch sensor 410 may include a base-transparent substrate 412 and a touch sensing unit 414. The photoelectric conversion device 420 may include a first electrode 422, a photoelectric conversion layer 424 and a second electrode 426. In this embodiment, the photoelectric conversion device 420 is disposed directly on the base-transparent substrate 412, and therefore shares one substrate with the touch sensing unit 414, so that the first electrode 422 contacts the base-transparent substrate 412 directly. In another embodiment, the photoelectric conversion device 420 may further include a transparent substrate (not shown), and the transparent substrate can fit, overlap, mount or be side by side with the base-transparent substrate 412. Therefore, the device 400 is formed, which can absorb optical energy and transform it into electrical energy, and has transparency properties as well.

Figure 6:
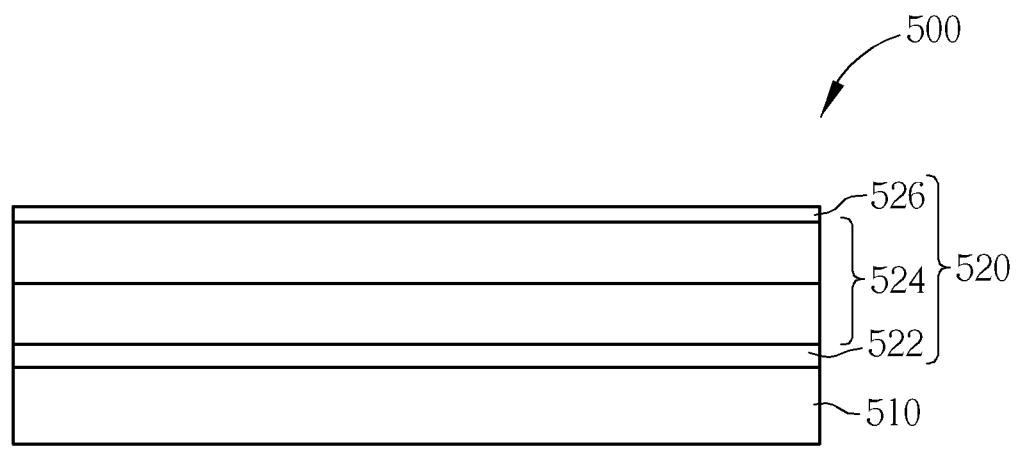
FIG. 6 schematically depicts a cross-sectional view of a device applying a photoelectric conversion device according to one embodiment of the present invention.

FIG. 6 schematically depicts a cross-sectional view of a device utilizing a photoelectric conversion device according to one embodiment of the present invention. As shown in FIG. 6, the photoelectric conversion device 520 of the present invention is used in a display 510, so that a device 500 is formed. The photoelectric conversion device 520 includes a first electrode 522, a photoelectric conversion layer 524 and a second electrode 526 sequentially formed on the display 510. The display 510 may be a whole wave band display, a partial wave band display, a monochrome display, a reflective display, a half penetrating and half reflective display, a thin-film transistor-liquid crystal display (TFT-LCD), an active matrix organic light-emitting diode (AMO-LED), an electroluminescent display (ELECTROLUMI-NESCENT, EL) an electrophoretic ink (E-Ink) display, an electrode wetting display, a carbon nano Tube (CNT) display, a micro electro mechanical systems (MEMS) display, a light interference display, a plasma display panel (PDP) display, a conventional cathode ray tube (CRT) display or etc. The display may further include a source, which may be a monochromatic light, a white light with a plurality of spectral peaks, a white light light-emitting diode, a red, blue and green light-emitting diode, a whole wave band spectrum white light, an organic light-emitting diode, a timing controlled colored light source or an electroluminescent white light or etc. The photoelectric conversion device 520 may also be used with other components, for example: sources such as a backlight, a monochrome source, a white source, a RGB source, a colored light source with separated timing, or a device such as a traffic sign, a banner, a reflection component, a banner with patterns or words. Applications of these sources or devices are similar to this embodiment, so as not to be described again. The photoelectric conversion device 520 may be located at the front of, above of or inside the glass, the protective layer, the modeling layer, the touch sensor, the display, the source, the traffic sign, the banner, the reflection component or the device having patterns or words. In this embodiment, the photoelectric conversion device 520 and the display 510 share one substrate. In another embodiment, the photoelectric conversion device 520 and the display 510 may not share the same substrate, and the forming methods are the same as aforesaid embodiment, so they will not be described again.

Figure 7:
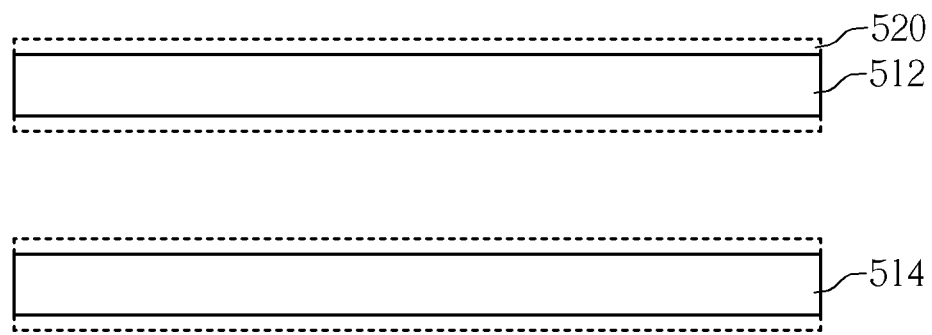
FIG. 7 schematically depicts a layout diagram applying the device of FIG. 6.

FIG. 7 schematically depicts a layout diagram of the device of FIG. 6. The display 510 may at least include a first substrate 512 and a second substrate 514, and the photoelectric conversion device 520 may be disposed on both sides of the first substrate 512 and the second substrate 514. More specifically, one photoelectric conversion device 520 may be disposed on one side of the first substrate 512 or the second substrate 514. Or, a plurality of photoelectric conversion devices 520 may be disposed respectively on both sides of the first substrate 512 and the second substrate 514 to improve the photoelectric conversion efficiency. Furthermore, the display 510 may further include other components such as a common electrode, an array electrode or a color filter etc, and the photoelectric conversion device 520 may be selectively disposed on these components.

Figure 8:
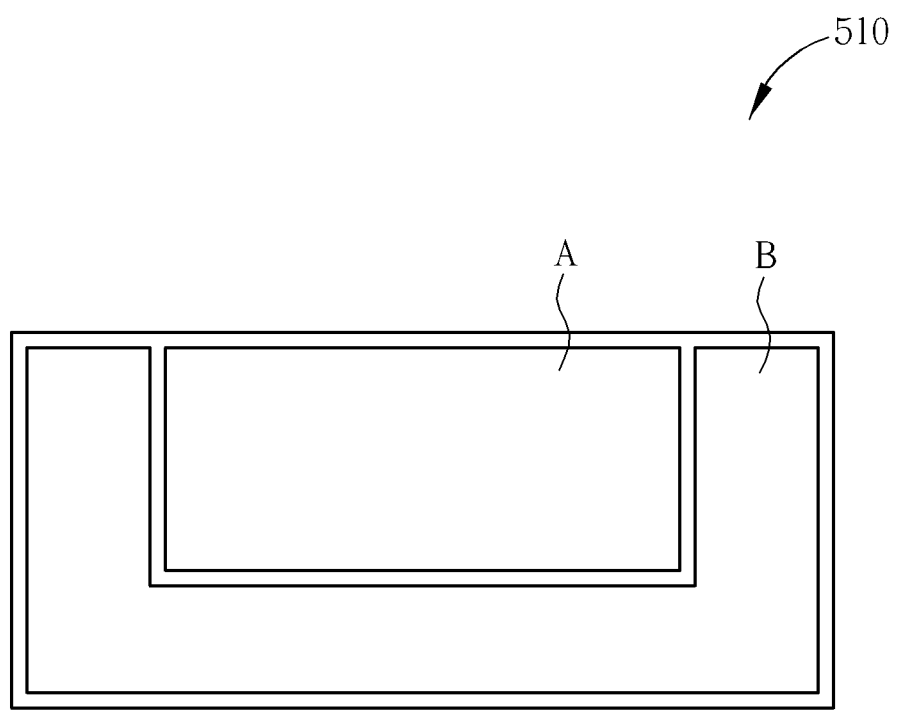
FIG. 8 schematically depicts a top view of the device of FIG. 6.

Furthermore, FIG. 8 schematically depicts a top view of the device of FIG. 6, wherein the display 510 may be divided into a display area A and a periphery area B. Due to visible light needed to penetrate the display area A, the photoelectric conversion device 520 is preferred to be disposed only in the display area A, while conventional non-transparent photoelectric conversion devices may be used in the periphery area B. The selection of the photoelectric conversion devices depends upon practical needs.

Figure 12:
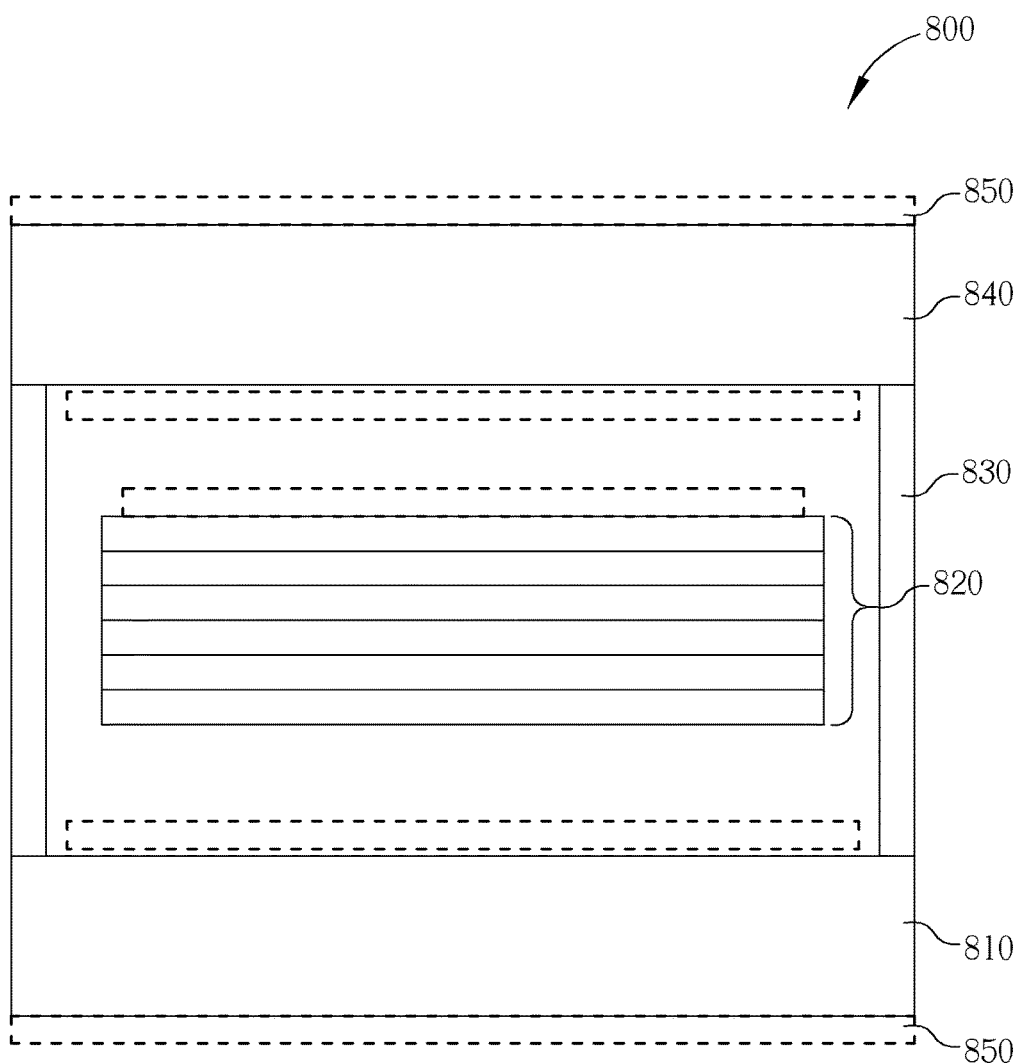
FIG. 12 schematically depicts a cross-sectional view of a light-emitting diode device applying the device of FIG. 6.

FIG. 12 schematically depicts a cross-sectional view of a light-emitting diode device applying the device of FIG. 6, wherein the light-emitting diode device 800 may be an active matrix organic light-emitting diode, an organic light-emitting diode or a macromolecule light-emitting diode etc. The light-emitting diode device 800 may include a first substrate 810, a light-emitting unit 820, a package unit 830 and a second substrate 840. The first substrate 810 may be regarded as a base substrate and the second substrate 840 may be regarded as a protective substrate or the second substrate. The light-emitting unit 820 is disposed on the first substrate 810. The package unit 830 is disposed between the first substrate 810 and the second substrate 840, so that the package unit 830, the first substrate 810 and the second substrate 840 constitute a close light-emitting diode device 800. The photoelectric conversion device 850 of the present invention may be disposed on the external side of the second substrate 840, the inner side of the second substrate 840, one side of the light-emitting unit 820, or the inner, the external side of the first substrate 810 etc.

In a preferred embodiment, the photoelectric conversion device 850 is disposed on the external side of the second substrate 840 or the external side of the first substrate 810, which may depend upon positions of the top illuminating type or bottom illuminating type active matrix organic light-emitting diode (AMOLED). Therefore, the shading of the photoelectric conversion device 850 by other components of the light-emitting diode device 800, that decreases the absorbing efficiency, can be avoided.

Figure 13:
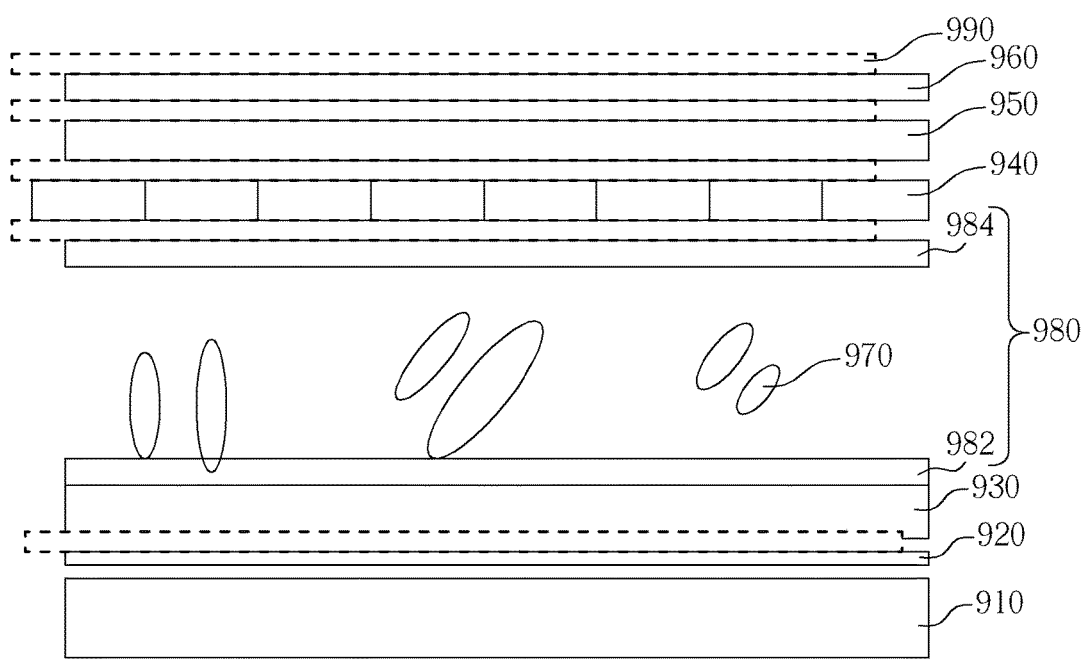
FIG. 13 schematically depicts a cross-sectional view of a liquid crystal display device applying the device of FIG. 6.

FIG. 13 schematically depicts a cross-sectional view of a liquid crystal display device comprising the device of FIG. 6. The liquid crystal display device 900 may be a thin-film transistors-liquid crystal display of crystalline silicon or low temperature poly-silicon (LTPS). The liquid crystal display device 900 may include a backlight 910, a first polarizer 920, a first substrate 930, a color filter 940, a second substrate 950, a second polarizer 960, a liquid crystal layer 970 and an electrode 980 including a pixel electrode 982 and a corresponding common electrode 984. The backlight 910 and the first polarizer 920 are disposed on the external side of the first substrate 930, and the first polarizer 920 is disposed between the backlight 910 and the first substrate 930; the pixel electrode 982 is disposed on the inner side of the first substrate 930. The color filter 940 and the second polarizer 960 are respectively disposed on the inner side and the external side of the second substrate 950. The common electrode 984 is disposed on the inner side of the color filter 940. The liquid crystal layer 970 is disposed between the pixel electrode 982 and the common electrode 984. The photoelectric conversion device 990 of the present invention may be disposed on/between each layer. For example, the photoelectric conversion device 990 may be disposed between the first polarizer 920 and the first substrate 930, between the color filter 940 and the common electrode 984, between the color filter 940 and the second substrate 950, between the second substrate 950 and the second polarizer 960, or the external side of the second polarizer 960. In a preferred embodiment, the photoelectric conversion device 990 of the present invention is disposed on the external side of the second polarizer 960, so that the shading of the photoelectric conversion device 990 by other components, which decreases the absorbing efficiency of the photoelectric conversion device 990, can be avoided.

Figure 9:
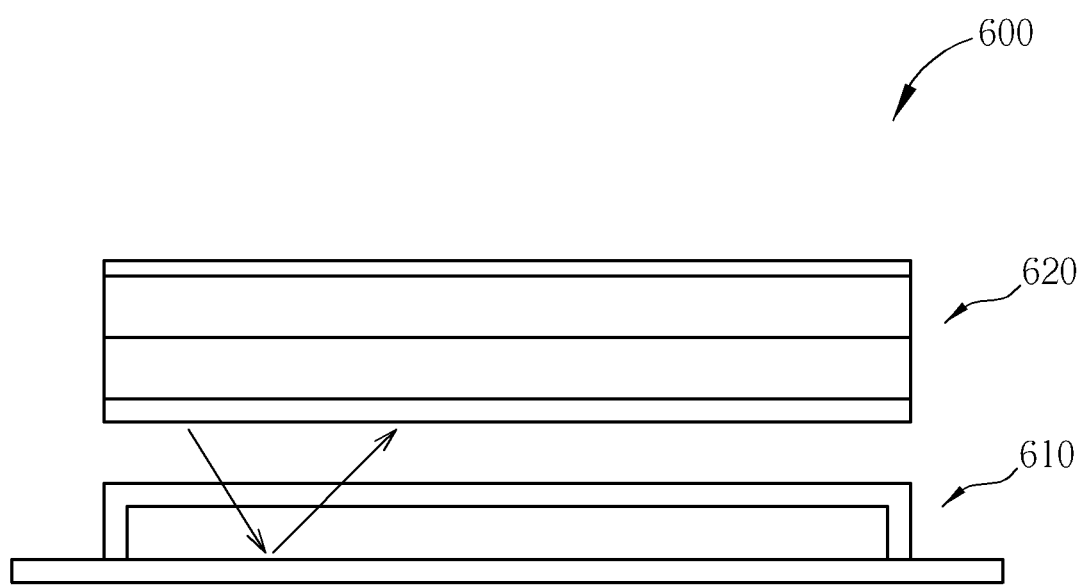
FIG. 9 schematically depicts a cross-sectional view of a device applying a photoelectric conversion device according to one embodiment of the present invention.

FIG. 9 schematically depicts a cross-sectional view of a device comprising a photoelectric conversion device according to one embodiment of the present invention. The photoelectric conversion device 620 may be paired with at least an auxiliary component 610, and the photoelectric conversion device 620 and the auxiliary component 610 therefore constitute a device 600. The transparent substrate may be an auxiliary component 610. There are light reflecting structures in at least some areas of the transparent substrate, so that light can be reflected back by the transparent substrate. Furthermore, the auxiliary component 610 may be a cavity component, a light interference component or a light reflecting component etc, which is disposed on the light path of the photoelectric conversion device 620, and can increase the light absorbing efficiency of the photoelectric conversion device 620.

Figure 10:
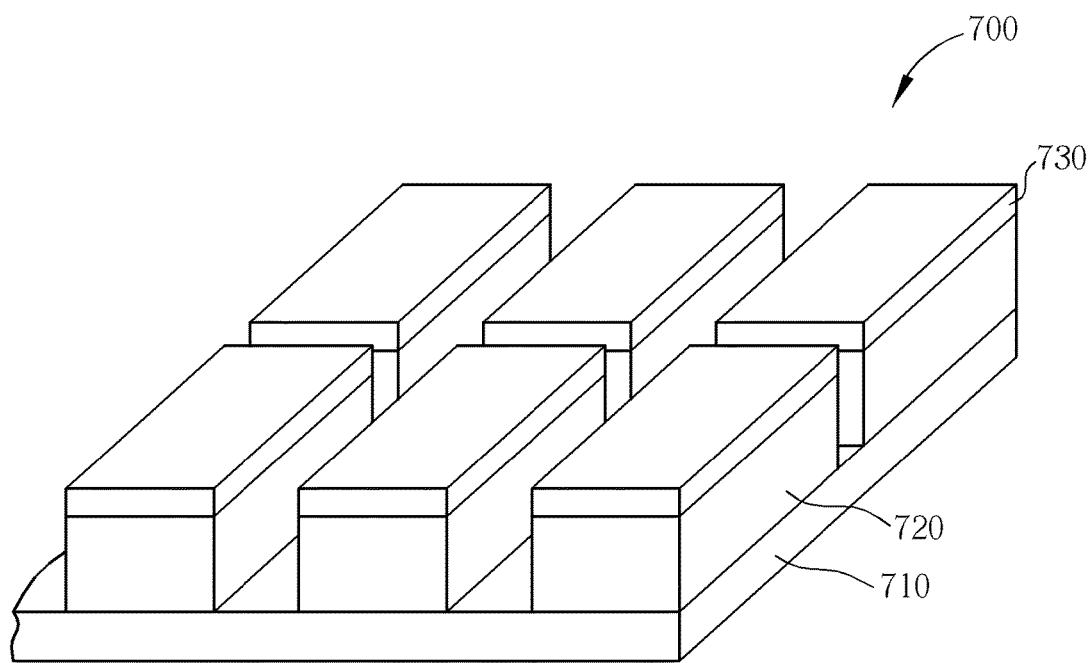
FIG. 10 schematically depicts a cross-sectional view of an array device applying a photoelectric conversion device according to one embodiment of the present invention.

The photoelectric conversion device of the present invention may be used in an array device. FIG. 10 schematically depicts a cross-sectional view of an array device comprising a photoelectric conversion device according to one embodiment of the present invention. The array device 700 may include a base substrate 710, a plurality of bases 720 and a plurality of photoelectric conversion devices 730, wherein the bases 720 and the photoelectric conversion device 730 are located on the base substrate 710. In this embodiment, each photoelectric conversion device 730 is disposed on each corresponding base 720, so that the array layout depends upon the locations of the bases 720. In another embodiment, each photoelectric conversion device 730 may be disposed staggeredly with the bases 720, or each photoelectric conversion device 730 may be distributed in the bases 720, to form an array device 700.

In the present invention, at least parts of the visible spectrum can pass though the photoelectric conversion device 320/420/520/620/730. More specifically, the photoelectric conversion layer 324/424/524 of the photoelectric conversion device 320/420/520/620/730 enables the optical light transmittance of at least a wave band of the visible spectrum to be larger than 20%. The photoelectric conversion layer 324/424/524 may be composed of photoelectric conversion materials such as a polycrystalline layer, a single crystal layer, a nano and organic layer, a silicon layer or a multi-compounds layer etc, that enabling at least parts of the visible spectrum to pass through. The photoelectric conversion layer 324/424/524 may be a structure composed of said single layer or said multilayers, selected and paired upon needs (as shown in FIG. 11). In another way, at least apart of the transparent substrate (not shown) of the present invention are transparent, which may be a glass substrate, a plastic substrate or a flexible substrate etc, wherein the transparent substrate (not shown) may have a planar shape or a curved shape. The material of the transparent substrate (not shown) may be composed of soda-lime glass, or at least a part of the transparent substrate area have a light reflective structure, enabling light to be reflected, but it is not limited thereto. The first electrode 322/422/522/ or the second electrode 326/426/526 may be a transparent electrode, wherein the material of the transparent electrode may be composed of transparent conductive oxide (TCO) such as aluminum zinc (AZO), grapheme, indium tin oxide (ITO), indium zinc oxide (IZO), or metal alloy such as aluminum (Al), copper (Cu), gold (Au) etc. Layouts of these components are similar to aforesaid embodiment, and won't be described here again.

Above all, the present invention provides a photoelectric conversion device, device and array device comprising the photoelectric conversion device, wherein the photoelectric conversion device enables at least parts of the visible spectrum to pass through. More specifically, the photoelectric conversion device has at least a photoelectric conversion layer, which may a single photoelectric conversion layer or a plurality of photoelectric conversion layers. The optical light transmittance of at least a wave band of visible spectrum of the photoelectric conversion layer is larger than 20%. So, the photoelectric conversion device formed by the photoelectric conversion layer of the present invention has higher photoelectric conversion efficiency than the photoelectric conversion device of the prior art formed by a non-transparent photoelectric conversion layer. The processing cost of patterning the non-transparent photoelectric conversion layer can be eliminated. The application art and application scope can be widened.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A liquid crystal display, comprising:
a first substrate;
a photoelectric conversion device on the first substrate, wherein the photoelectric conversion device comprises:
a transparent substrate with at least some areas being transparent and/or at least some areas being light reflecting structures to reflect light;
a first electrode located on the transparent substrate;
at least a photoelectric conversion layer located on and contact the first electrode, wherein the optical light transmittance of each photoelectric conversion layer in at least a portion of the visible spectrum is higher than 20%, wherein the photoelectric conversion layer comprises a compensation unit for correcting color chromatic polarization; and
a second electrode located on and contact the photoelectric conversion layer;
a color filter on the photoelectric conversion device; and
a second substrate on the color filter.

* * * * *